United States Patent
Zhu

(10) Patent No.: US 11,322,720 B2
(45) Date of Patent: May 3, 2022

(54) DISPLAY PANEL HAVING A GROOVED NON-DISPLAY AREA

(71) Applicant: Wuhan China Star Optoelectronics Semiconductor Display Technology Co., Ltd., Hubei (CN)

(72) Inventor: San Zhu, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/753,904

(22) PCT Filed: Mar. 16, 2020

(86) PCT No.: PCT/CN2020/079495
§ 371 (c)(1),
(2) Date: Apr. 6, 2020

(87) PCT Pub. No.: WO2021/168925
PCT Pub. Date: Sep. 2, 2021

(65) Prior Publication Data
US 2021/0273199 A1    Sep. 2, 2021

(30) Foreign Application Priority Data
Feb. 27, 2020    (CN) .................... 202010125673.5

(51) Int. Cl.
*H01L 51/00*    (2006.01)
*H01L 51/52*    (2006.01)
(Continued)

(52) U.S. Cl.
CPC .... *H01L 51/5253* (2013.01); *G02F 1/133305* (2013.01); *G09F 9/301* (2013.01);
(Continued)

(58) Field of Classification Search
CPC ........... H01L 51/5253; H01L 2251/301; H01L 51/0097; H01L 2251/5338; G02F 1/133305; G09F 9/301
See application file for complete search history.

(56) References Cited

U.S. PATENT DOCUMENTS 9,362,523 B2 * 6/2016 Zhang ................ H01L 23/315
10,283,575 B2 * 5/2019 Zhai ..................... G06F 3/0412
(Continued)

FOREIGN PATENT DOCUMENTS

CN    206650080 U    11/2017
CN    108258146 A    7/2018
(Continued)

*Primary Examiner* — Ida M Soward
(74) *Attorney, Agent, or Firm* — Luedeka Neely Group, P.C.

(57) ABSTRACT

The present application proposes a display panel including a substrate including a display area and a non-display area surrounding the display area; a light-emitting layer located in the display area of the substrate; a groove obtained by exposing and developing the substrate, and disposed in the non-display area of the substrate and surrounding the display area; a thin-film encapsulation layer covering the light-emitting layer, and including an inorganic layer and an organic layer which are disposed alternately, wherein the organic layer is located in a region surrounded by the groove. The display panel has better bending resistance.

8 Claims, 4 Drawing Sheets

(51) Int. Cl.
 *G02F 1/133* (2006.01)
 *G09F 9/30* (2006.01)
 *G02F 1/1333* (2006.01)

(52) U.S. Cl.
 CPC .... *H01L 51/0097* (2013.01); *H01L 2251/301* (2013.01); *H01L 2251/5338* (2013.01)

(56) References Cited

U.S. PATENT DOCUMENTS

| | | | | |
|---|---|---|---|---|
| 10,453,912 | B2* | 10/2019 | Sung | H01L 27/3258 |
| 10,673,020 | B2* | 6/2020 | Kim | H01L 27/3244 |
| 10,840,478 | B2* | 11/2020 | Han | H01L 27/3262 |
| 2007/0145883 | A1* | 6/2007 | Ohashi | H01L 33/20 |
| | | | | 313/498 |
| 2008/0238295 | A1* | 10/2008 | Takei | H01L 51/0003 |
| | | | | 313/499 |
| 2015/0069419 | A1* | 3/2015 | Mori | H01L 33/20 |
| | | | | 257/79 |
| 2018/0033800 | A1* | 2/2018 | Koide | G06F 3/0445 |
| 2018/0151833 | A1* | 5/2018 | Riegel | H01L 51/5253 |
| 2019/0067410 | A1* | 2/2019 | Kwon | H01L 51/0097 |
| 2019/0173048 | A1* | 6/2019 | Sung | G09G 3/3233 |
| 2019/0214587 | A1 | 7/2019 | Kim | |
| 2019/0312096 | A1* | 10/2019 | Na | H01L 27/3276 |
| 2019/0334120 | A1* | 10/2019 | Seo | H01L 51/5253 |
| 2020/0058899 | A1* | 2/2020 | Bu | G02F 1/133308 |
| 2020/0106046 | A1* | 4/2020 | Kim | H01L 51/0097 |
| 2020/0119304 | A1* | 4/2020 | Choi | H01L 51/5237 |
| 2020/0127216 | A1 | 4/2020 | Tao | |
| 2020/0127233 | A1* | 4/2020 | Sung | H01L 27/3258 |
| 2020/0144341 | A1* | 5/2020 | Choi | H01L 27/3258 |
| 2020/0144535 | A1* | 5/2020 | Kim | H01L 51/5256 |
| 2020/0161582 | A1* | 5/2020 | Choi | H01L 27/326 |
| 2020/0174295 | A1* | 6/2020 | Baek | G02F 1/1339 |
| 2020/0176538 | A1* | 6/2020 | Um | H01L 27/3272 |
| 2020/0235333 | A1* | 7/2020 | Sung | G06F 1/1686 |
| 2020/0243401 | A1* | 7/2020 | Wang | H01L 51/5253 |
| 2020/0251683 | A1 | 8/2020 | Sun | |
| 2020/0295299 | A1 | 9/2020 | Yin et al. | |
| 2020/0313101 | A1* | 10/2020 | Jung | H01L 51/5237 |
| 2021/0118973 | A1* | 4/2021 | Kim | H05K 1/111 |
| 2021/0151715 | A1* | 5/2021 | Lee | H01L 51/56 |
| 2021/0193760 | A1* | 6/2021 | Xie | H01L 51/5253 |

FOREIGN PATENT DOCUMENTS

| | | |
|---|---|---|
| CN | 109065552 A | 12/2018 |
| CN | 109326739 A | 2/2019 |
| CN | 109461837 A | 3/2019 |
| CN | 109904341 A | 6/2019 |
| GN | 103474561 A | 12/2013 |
| GN | 203883009 U | 10/2014 |
| GN | 110611045 A | 12/2019 |

* cited by examiner

DISPLAY PANEL HAVING A GROOVED NON-DISPLAY AREA

FIELD OF INVENTION

The present application relates a field of display technology, and in particular, to a display panel, a display device, and a manufacturing method thereof.

DESCRIPTION OF PRIOR ART

Organic light-emitting diode (OLED) displays are self-luminous displays. Compared with liquid crystal displays (LCDs), OLED displays do not require a backlight, so OLED displays are relatively light and thin. In addition, OLED displays is also increasingly used in various high-performance display fields due to its advantages such as high brightness, low power consumption, wide viewing angles, high response times, and a wide range of operation temperature.

In the prior art, a thin-film encapsulation method is often used to ensure that organic light-emitting materials and electrodes are not invaded by water vapor and oxygen in the external environment. Generally, in order to prevent the organic material in the thin-film package from overflowing to an edge of the display panel during the manufacturing process, which impacts the lateral encapsulation effect of the display panel, a retaining wall is usually provided on the display panel to prevent the organic material from flowing out.

Retaining walls in the prior art often are made of organic acrylic materials. Because the organic acrylic materials are not resistant to bending, cracks are easily generated when the display panel is bent, which not only impacts the bending resistance of the display panel, but also further impacts the thin-film encapsulation performance of the display panel due to propagation of the cracks.

SUMMARY OF INVENTION

The present application provides a display panel, a display device, and a manufacturing method thereof to solve the technical problem of the prior art that when the display panel is bent, the stress at the retaining wall is concentrated to damage the encapsulation layer, which causes encapsulation to fail.

In order to solve the above technical problems, the present application provides a display panel, including: a substrate including a display area and a non-display area surrounding the display area; a light-emitting layer located in the display area of the substrate; a groove obtained by exposing and developing the substrate, and disposed in the non-display area of the substrate and surrounding the display area; a thin-film encapsulation layer covering the light-emitting layer, and including an inorganic layer and an organic layer which are disposed alternately, wherein the organic layer is located in a region surrounded by the groove.

The groove has a shape selected from any one or a combination of arc, square, trapezoid, and triangle.

The groove includes a first groove and a second groove surrounding the first groove.

The thin-film encapsulation layer includes at least two inorganic layers and one organic layer, and a side of the thin-film encapsulation layer adjacent to the substrate and a side away from the substrate are both provided with the inorganic layers.

The thin-film encapsulation layer includes at least a first inorganic layer, a first organic layer, and a second inorganic layer that are sequentially stacked, the first inorganic layer is located on a side of the first organic layer adjacent to the substrate, and the second inorganic layer is located on a side of the first organic layer away from the substrate.

The inorganic layer is made of a material including silicon nitride or silicon oxide, and the organic layer is made of a material including epoxy resin, acrylate, orthoacrylic acid, or methacrylic acid.

In order to solve the above technical problem, the present application further provides a display device, which includes the above-described display panel.

The groove of the display device at a bending area has a corrugated shape.

In order to solve the above technical problems, the present application also provides a method of manufacturing a display panel including: providing a substrate, including a display area and a non-display area surrounding the display area; forming a light-emitting layer in the display area of the substrate; forming a groove on a side of the substrate adjacent to the light-emitting layer and in a non-display area of the substrate to surround the display area; and forming a thin-film encapsulation layer covering the light-emitting layer and including an inorganic layer and an organic layer which are disposed alternately, wherein the organic layer is located in a region surrounded by the groove.

The step of forming a groove on a side of the substrate adjacent to the light-emitting layer includes: exposing and developing the substrate to form the groove on the side of the substrate adjacent to the light-emitting layer.

An advantage of the present application is that the display panel of the present application disposes a groove on the substrate, which can effectively improve the bending resistance and thin-film encapsulation performance of the display panel.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Figure 1:
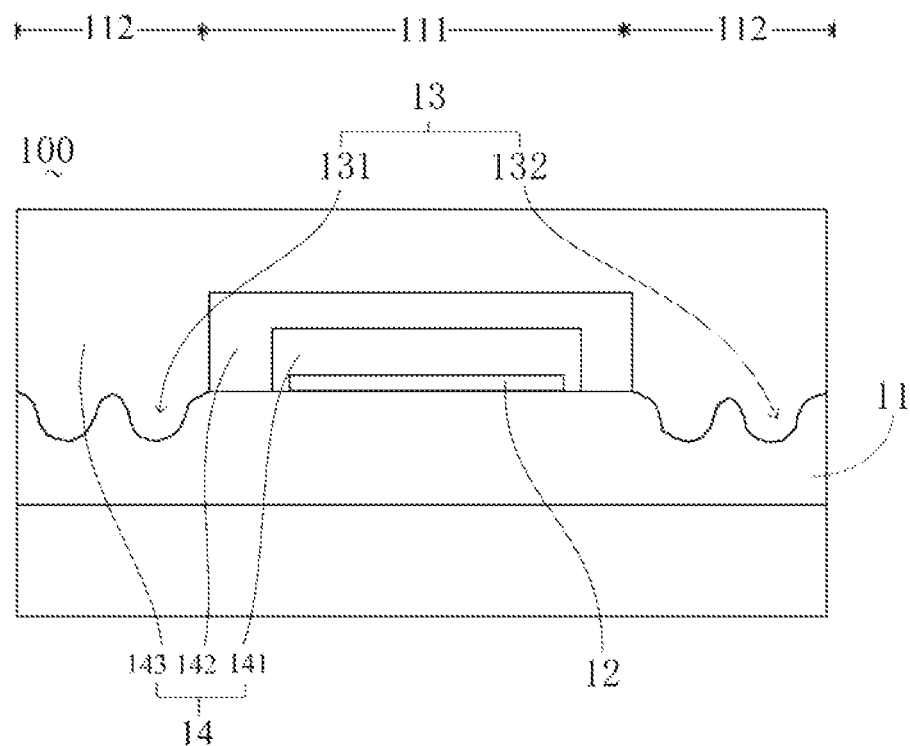
FIG. 1 is a schematic structural diagram of a display panel provided by an embodiment of the present application.

Referring to FIG. 1, FIG. 1 is a schematic structural diagram of an embodiment of a display panel provided by the present application. The display panel 100 in FIG. 1 includes a substrate 11, a light-emitting layer 12, and a thin-film encapsulation layer 14, wherein a groove 13 is provided on the substrate 11.

The substrate 11 includes a display area 111 and a non-display area 112 surrounding the display area 111. The substrate 11, the light-emitting layer 12, and the thin-film encapsulation layer 14 are sequentially stacked, and the light-emitting layer 12 is located in the display area 111 of the substrate 11. The groove 13 is located in the non-display area 112 of the substrate 11 and surrounds the display area 111. The groove 13 can be obtained by exposing and developing a side of the substrate 11 adjacent to the light-emitting layer 12.

The thin-film encapsulation layer 14 covers the light-emitting layer 12. The thin-film encapsulation layer 14 includes an inorganic layer 141 and an organic layer 142 which are disposed alternately. The organic layer 142 is located in a region surrounded by the groove 13.

In this embodiment, the substrate 11 may be an array substrate that drives the light-emitting layer 12 to emit light. The substrate 11 includes a display area 111 and a non-display area 112. The display area 111 corresponds to the light-emitting layer 12 to realize image display. An area corresponding to the non-display area 112 dose not display an image. The substrate 11 may be transparent, translucent, or opaque.

The thin-film encapsulation layer 14 is located on the light-emitting layer 12. The thin-film encapsulation layer 14 protects the light-emitting layer 12 and other layers from being impacted by external moisture, oxygen, and the like. The thin-film encapsulation layer 14 may include an inorganic layer 141 and an organic layer 142, and the inorganic layer 141 and the organic layer 142 are stacked alternately. The groove 13 is disposed in the non-display area 112 of the substrate 11 and surrounds the display area 111. The groove 13 serves as a cut-off layer of the organic layer 142 in the thin-film encapsulation layer 14 and is covered by the inorganic layer 141 of the thin-film encapsulation layer 14. Meanwhile, the groove 13 can further improve the effect of blocking water and oxygen of the display panel 100, preventing transfer and propagation of cracks in the inorganic layer 141.

For flexible OLED display panels, water vapor intrusion from front and lateral sides are more common issues impacting the service life of OLED display panels. In the prior art, organic acrylic materials are often used for retaining walls, and organic acrylic materials are not resistant to bending. As the flexible OLED display panel is bent multiple time, cracks are easily generated on the retaining wall, and the cracks further expand, which may impact the thin-film encapsulation performance of the display panel. Because adhesion between the organic acrylic material and the inorganic layer 141 of the thin-film encapsulation layer 14 is weak, when the display panel is bent, the inorganic layer 141 is easily separated from the retaining wall, so that water vapor and oxygen can easily enter the inside of the display panel through the separated gap between the inorganic layer 141 and the retaining wall, and impacts the lateral water blocking performance of the thin-film encapsulation layer 14, thereby impacting the service life of the display panel.

In this embodiment, the display panel 100 reduces the concentrated stress generated during bending through the groove 13, so that cracks are not easily generated when the display panel 100 is bent, and the bending resistance and thin-film encapsulation performance of the display panel 100 are improved.

Further, the side of the thin-film encapsulation layer 14 adjacent to the substrate 11 and the side away from the substrate 11 are both provided with inorganic layer 141.

Specifically, the inorganic layer 141 covers the groove 13, and the organic layer 142 has a certain fluidity. The groove 13 restricts the organic layer 142 in a region surrounded by the groove 13 to prevent the organic layer 142 from spreading and increase a width of the non-display area 112. By disposing the inorganic layers 141, 143 on the side of the thin-film encapsulation layer 14 adjacent to the substrate 11 and the side away from the substrate 11, and making the inorganic layer 143 cover the groove 13, water vapor and oxygen are better prevented from entering the display panel 100, thus preventing the display panel 100 from corrosion by water vapor or oxygen.

In this embodiment, the thin-film encapsulation layer 14 includes a first inorganic layer 141, a first organic layer 142, and a second inorganic layer 143.

The first inorganic layer 141 is located on a side of the first organic layer 142 adjacent to the substrate 11; and the second inorganic layer 143 is located on a side of the first organic layer 142 away from the substrate 11.

Specifically, the first inorganic layer 141 and the second inorganic layer 143 are mainly configured to prevent water vapor and oxygen from entering the display panel 100 to corrode the light-emitting layer, and the first organic layer 142 is mainly configured to function a buffer to reduce the stress between the first inorganic layer 141 and the second inorganic layer 143. The thin-film encapsulation layer 14 includes three layers: a first inorganic layer 141, a first organic layer 142, and a second inorganic layer 143. On the one hand, it can ensure that water vapor and oxygen are prevented from entering the display panel 100; on the other hand, the thin-film encapsulation layer 14 can have a smaller thickness, complying with the trend of developing thin and light display panels.

It should be noted that this embodiment only exemplarily illustrates a case where the thin-film encapsulation layer 14 includes two inorganic layers 141, 143 and one organic layer 142, but it is not a limitation on the present invention. In other embodiments, the thin-film encapsulation layer 14 may further include a plurality of inorganic layers and a plurality of organic layers disposed alternately.

In the above, the material of the inorganic layer includes silicon nitride or silicon oxide, and the material of the organic layer includes epoxy resin, acrylate, orthoacrylic acid, or methacrylic acid.

In the present application, the groove has a shape selected from any one or a combination of arc, square, trapezoid, and triangle. In order to further improve the film encapsulation effect, the substrate 11 may further be provided with a plurality of rows of grooves 13, which specifically include at least a first groove 131 and a second groove 132 around the first groove.

Figure 2:
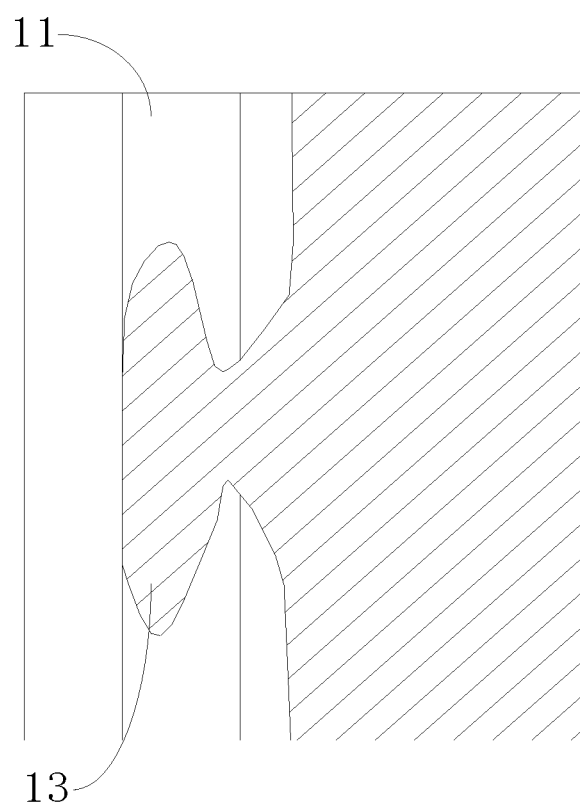
FIG. 2 is a schematic diagram of an anti-overflow effect of the display panel provided in FIG. 1.

The specific anti-overflow effect of the groove 13 is shown in FIG. 2. As shown in FIG. 2, the organic polymer in the thin-film encapsulation process is printed in a specific area, and the specific area is the display area 111. When the abnormal edge leveling occurs, the organic polymer first enters the groove 13 and flows along the groove 13, slowing down the tendency of the polymer to flow along the overflow direction, so that it flows in the region inside the groove 13, thereby greatly reducing the feasibility of overflow of the polymer when the organic polymer is leveled.

Figure 3:
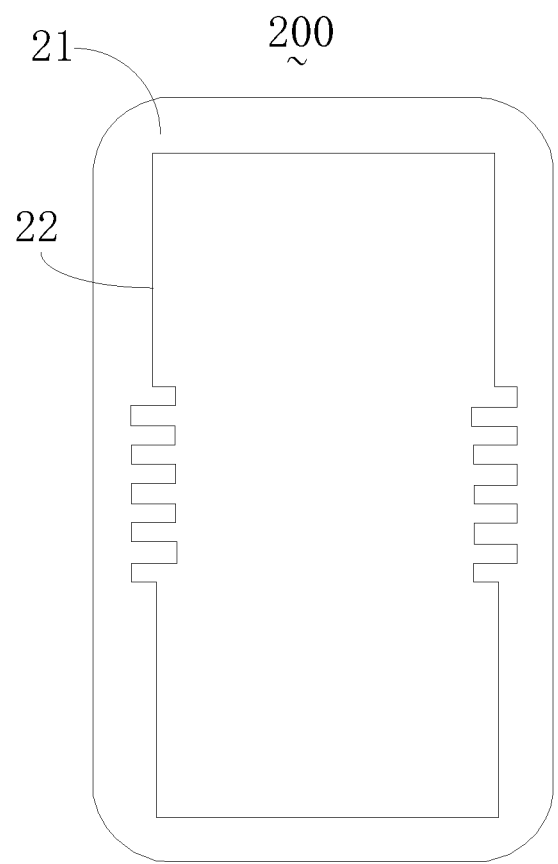
FIG. 3 is a schematic structural diagram of a display device provided by an embodiment of the present application.

The present application also provides a display device. Referring to FIG. 3 for details, FIG. 3 is a schematic structural diagram of a display device provided by an embodiment of the present application.

The display device 200 of this embodiment includes a case 21 and a display panel (not shown) in the above embodiment. As shown in FIG. 3, at the bending area of the display device 200, the groove 22 on the display panel has a corrugated design, which can greatly increase a number of times that the display panel can be bent.

Figure 4:
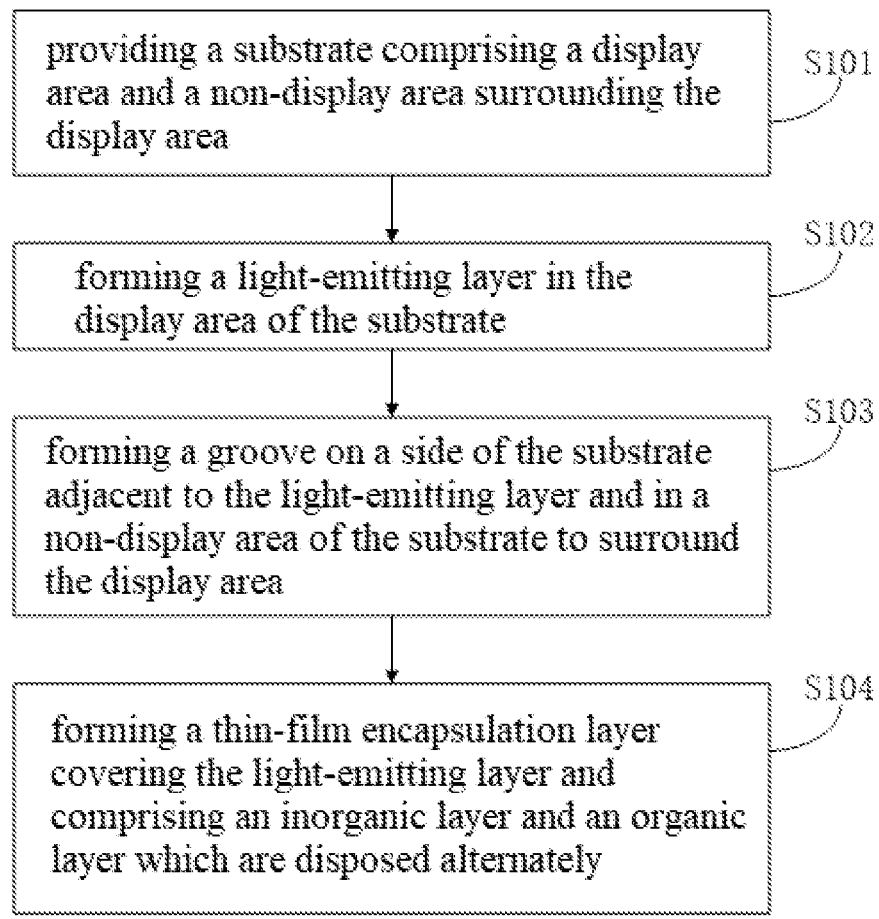
FIG. 4 is a schematic flowchart of a method of manufacturing a display panel provided by an embodiment of the present application.

The present application also provides a method of manufacturing a display panel. Referring to FIG. 4 for details, FIG. 4 is a schematic flowchart of a method of manufacturing a display panel provided by an embodiment of the present application.

As shown in FIG. 4, the method of manufacturing the display panel in this embodiment specifically includes the following steps:

S401: providing a substrate, including a display area and a non-display area surrounding the display area;

S402: forming a light-emitting layer in the display area of the substrate;

S403: forming a groove on a side of the substrate adjacent to the light-emitting layer and in a non-display area of the substrate to surround the display area, wherein, the substrate is exposed and developed with a photosensitive polyimide material, so that a groove is formed on a side of the substrate adjacent to the light-emitting layer; and S404: forming a thin-film encapsulation layer 14 covering the light-emitting layer and including an inorganic layer 141 and an organic layer 142 which are disposed alternately, wherein the organic layer is located in a region surrounded by the groove.

Figure 5:
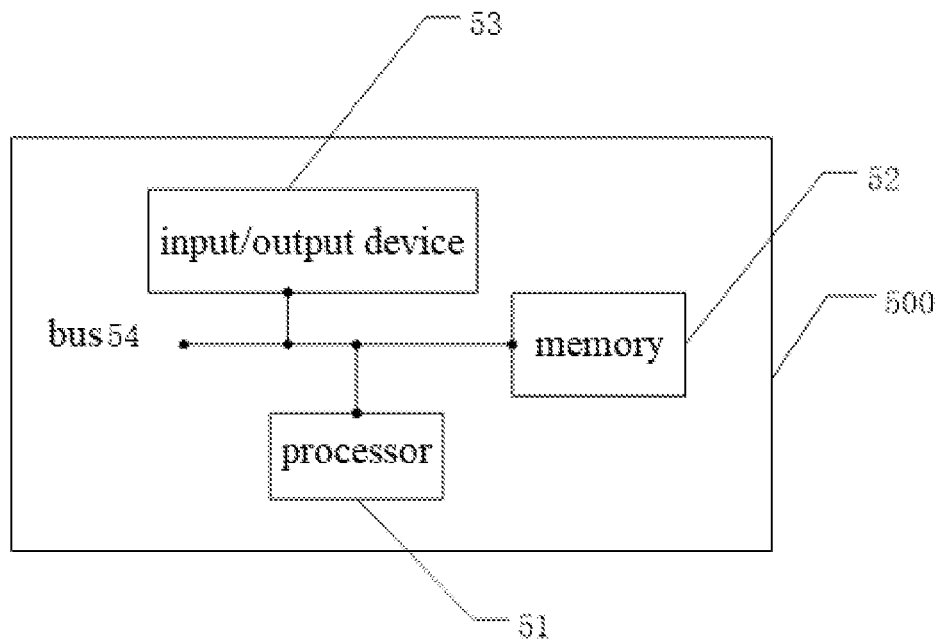
FIG. 5 is a schematic structural diagram of an apparatus of manufacturing a display panel provided by an embodiment of the present application.

In order to implement the above-mentioned method of manufacturing a display panel, the present application also provides an apparatus of manufacturing a display panel. For details, Referring to FIG. 5, FIG. 5 is a schematic structural diagram of an apparatus of manufacturing a display panel provided by an embodiment of the present application.

Figure 6:
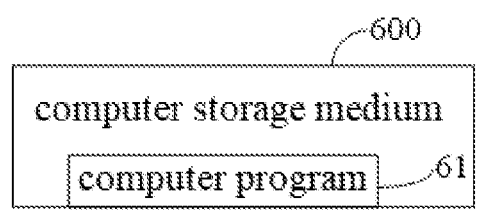
FIG. 6 is a schematic structural diagram of a computer storage medium provided by an embodiment of the present application.

As shown in FIG. 6, the apparatus 500 of manufacturing a display panel in this embodiment includes a processor 51, a memory 52, an input/output device 53, and a bus 54.

The processor 51, the memory 52, and the input/output device 53 are respectively connected to the bus 54. A computer program is stored in the memory 52, and the processor 51 is configured to execute the computer program to implement the method of manufacturing the display panel described in the foregoing embodiment.

In this embodiment, the processor 51 may also be referred to as a central processing unit (CPU). The processor 51 may be an integrated circuit chip and has a signal processing capability. The processor 51 may also be a general-purpose processor, a digital signal processor (DSP), an application specific integrated circuit (ASIC), a field programmable gate array (FPGA) or other programmable logic device, a discrete gate or transistor logic device, and/or a discrete hardware component. The general-purpose processor may be a microprocessor. Alternatively, the processor 51 may be any conventional processor or the like.

The present application also provides a computer storage medium. As shown in FIG. 6, the computer storage medium 600 is configured to store a computer program 61. When the computer program 61 is executed by a processor, it is used to implement the method of manufacturing the display panel described in the embodiments of the present application.

The method involved in the embodiment of the method for manufacturing a display panel provided in this application may be stored in a device, such as a computer-readable storage medium, when it exists in the form of a software functional unit and is sold or used as an independent product when implemented. Based on this understanding, the technical solution of the present application is essentially a part that contributes to the prior art or all or part of the technical solution of the present application can be embodied in the form of a software product, which is stored in a storage medium including instructions to cause a computer device (which may be a personal computer, a server, or a network device) or a processor to perform all or part of the steps of the method according to various embodiments of the present invention. The aforementioned storage media include a media that can store program code such as a USB stick, a mobile hard disk, a read-only memory (ROM), a random access memory (RAM), a magnetic disk, or an optical disk etc.

The above description is only an embodiment of the present invention, and thus does not limit the scope of the patent of the present invention. Any equivalent structure or equivalent process transformation made by using the description and drawings of the present invention, or directly or indirectly applied to other related technologies, is similarly included in the scope of patent protection of the present application.

The subject matter of the present application can be manufactured and used in industry with industrial applicability.

What is claimed is:

1. A display panel with a bending area, comprising:
    a substrate comprising a display area and a non-display area surrounding the display area;
    a light-emitting layer located in the display area of the substrate;
    a groove obtained by exposing and developing the substrate, and disposed in the non-display area of the substrate and surrounding the display area, wherein the groove is defined only at the bending area of the display panel;
    a thin-film encapsulation layer covering the light-emitting layer, and comprising an inorganic layer and an organic layer which are disposed alternately, wherein the organic layer is located in a region surrounded by the groove.

2. The display panel according to claim 1, wherein the groove has a shape selected from any one or a combination of arc, square, trapezoid, and triangle.

3. The display panel according to claim 2, wherein the groove comprises a first groove and a second groove surrounding the first groove.

4. The display panel according to claim 1, wherein the thin-film encapsulation layer comprises at least two inorganic layers and one organic layer.

5. The display panel according to claim 4, wherein the thin-film encapsulation layer comprises at least a first inorganic layer, a first organic layer, and a second inorganic layer that are sequentially stacked.

6. The display panel according to claim 1, wherein the inorganic layer is made of a material comprising silicon nitride or silicon oxide, and the organic layer is made of a material comprising epoxy resin, acrylate, orthoacrylic acid, or methacrylic acid.

7. A display device, comprising the display panel according to claim 1.

8. The display device according to claim 7, wherein the groove of the display device at the bending area has a corrugated shape.

* * * * *